(12) United States Patent
Suzuki (10) Patent No.: US 8,125,613 B2
(45) Date of Patent: Feb. 28, 2012

(54) EXPOSURE APPARATUS, EXPOSURE METHOD, AND DEVICE MANUFACTURING METHOD

(75) Inventor: Kousuke Suzuki, Saitama (JP)

(73) Assignee: Nikon Corporation, Tokyo (JP)

( * ) Notice: Subject to any disclaimer, the term of this patent is extended or adjusted under 35 U.S.C. 154(b) by 246 days.

(21) Appl. No.: 11/785,715

(22) Filed: Apr. 19, 2007

(65) Prior Publication Data

US 2007/0291243 A1    Dec. 20, 2007

(30) Foreign Application Priority Data

Apr. 21, 2006 (JP) .................................. 2006-118004

(51) Int. Cl.
G03B 27/32 (2006.01)
G03B 27/42 (2006.01)
G03B 27/52 (2006.01)
G03B 27/58 (2006.01)
G03B 27/62 (2006.01)
G01B 11/00 (2006.01)

(52) U.S. Cl. ................ 355/53; 355/55; 355/72; 355/75; 355/77; 356/399

(58) Field of Classification Search .................... 355/52, 355/53, 55, 77, 67; 356/399, 400, 401; 430/22, 430/300
See application file for complete search history.

(56) References Cited

U.S. PATENT DOCUMENTS

| 4,780,617 A | 10/1988 | Umatate et al. |
| 5,581,324 A | 12/1996 | Miyai et al. |
| 5,591,958 A | 1/1997 | Nishi et al. |
| 5,684,569 A | 11/1997 | Sugaya et al. |
| 6,235,438 B1 | 5/2001 | Suzuki et al. |
| 6,312,859 B1 | 11/2001 | Taniguchi |
| 6,496,306 B1 | 12/2002 | Shafer et al. |
| 6,509,956 B2 | 1/2003 | Kobayashi |
| 6,608,681 B2 | 8/2003 | Tanaka et al. |
| 6,699,628 B2 * | 3/2004 | Shima .............................. 430/22 |
| 6,778,257 B2 | 8/2004 | Bleeker et al. |
| 2002/0008862 A1 | 1/2002 | Kobayashi |

(Continued)

FOREIGN PATENT DOCUMENTS

JP    A 61-044429    3/1986

(Continued)

OTHER PUBLICATIONS

International Search Report for Application No. PCT/JP2007/058581; mailed May 22, 2007.

(Continued)

*Primary Examiner* — Hung Henry Nguyen
*Assistant Examiner* — Colin Kreutzer
(74) *Attorney, Agent, or Firm* — Oliff & Berridge, PLC (57) ABSTRACT

An exposure apparatus includes a projection optical system, which projects a pattern of a mask onto a prescribed exposure area on a substrate at a prescribed projection magnification. The optical axis center of the projection optical system is set to a position different from that of the center of the projection area onto which the pattern is projected. The exposure apparatus further includes a magnification modification device, which modifies the projection magnification of the projection optical system; a calculation device, which calculates a shift length of the center of the projection area associated with modification of the projection magnification; and a correction device, which corrects the position information of the exposure area based on the shift length of the center of the projection area.

15 Claims, 6 Drawing Sheets

U.S. PATENT DOCUMENTS

| | | |
|---|---|---|
| 2002/0041377 A1 | 4/2002 | Hagiwara et al. |
| 2003/0011755 A1 | 1/2003 | Omura et al. |
| 2004/0126004 A1 | 7/2004 | Kikuchi |
| 2005/0248856 A1 | 11/2005 | Omura et al. |

FOREIGN PATENT DOCUMENTS

| | | | |
|---|---|---|---|
| JP | A 06-132191 | | 5/1994 |
| JP | A 07-183186 | | 7/1995 |
| JP | A 08-313842 | | 11/1996 |
| JP | A 10-064808 | | 3/1998 |
| JP | A 11-194479 | | 7/1999 |
| JP | A 11-195602 | | 7/1999 |
| JP | A 2000-012453 | | 1/2000 |
| JP | A 2000-029202 | | 1/2000 |
| JP | A 2000-047114 | | 2/2000 |
| JP | A 2001-345243 | | 12/2001 |
| JP | A 2002-014005 | | 1/2002 |
| JP | A 2002-033271 | | 1/2002 |
| JP | A 2002-353121 | | 12/2002 |
| JP | A 2004-145269 | | 5/2004 |
| JP | A 2004-304135 | | 10/2004 |
| WO | WO 99/34255 | | 7/1999 |
| WO | WO 99/34255 | A1 | 7/1999 |
| WO | WO 99/50712 | | 7/1999 |
| WO | WO 99/49504 | A1 | 9/1999 |
| WO | WO 99/50712 | A1 | 10/1999 |
| WO | WO 99/66370 | | 12/1999 |
| WO | WO 99/66370 | A1 | 12/1999 |
| WO | WO 01/65296 | A1 | 9/2001 |
| WO | WO 2004/019128 | A2 | 3/2004 |
| WO | WO 2005/059617 | A2 | 6/2005 |
| WO | WO 2005/059618 | A2 | 6/2005 |

OTHER PUBLICATIONS

Written Opinion of the International Searching Authority for Application No. PCT/JP2007/058581; mailed May 22, 2007 (with translation).

Sep. 20, 2011 Office Action issued in JP Application No. 2008-512155 (with English translation).

* cited by examiner

EXPOSURE APPARATUS, EXPOSURE METHOD, AND DEVICE MANUFACTURING METHOD

CROSS-REFERENCE TO RELATED APPLICATION

This application claims priority to Japanese Patent Application No. 2006-118004, filed Apr. 21, 2006, the contents of which are incorporated herein by reference.

BACKGROUND OF THE INVENTION

1. Field of the Invention

This invention relates to an exposure apparatus, an exposure method, and a device manufacturing method.

2. Description of Related Art

There exist exposure apparatuses which employ catadioptric type projection optical systems using a concave mirror, such as that described for example in Japanese Unexamined Patent Application, Publication No. H06-132191. In this type of exposure apparatus, it is known that when an area shifted from the optical axis of the projection optical system is used as the exposure area, if the projection magnification is changed, the center of the projected image is shifted (image shift). Japanese Unexamined Patent Application, Publication No. 2004-145269 discloses technology to insert an optical element for correction into the optical path, in order to correct image shift.

In technology of the prior art such as that described above, when an optical element to correct image shift is provided and is inclined to correct image shift, there is the possibility of fluctuation of other aberrations. Further, when the projection magnification is changed, the baseline value, which is the distance between the reticle center and the alignment optical system, fluctuates due to image shift, and so processing to measure the baseline value is again performed. If the baseline value is measured each time the projection magnification is changed, throughput falls sharply.

A purpose of some aspects of the invention is to provide an exposure apparatus, an exposure method, and a device manufacturing method which enable high-precision exposure processing.

SUMMARY OF THE INVENTION

According to a first aspect of the invention, an exposure apparatus is provided, having a projection optical system that exposes a predetermined exposure area on a substrate with a pattern of a mask at a predetermined projection magnification, a center of an optical axis of the projection optical system being set at a different position from a center of the exposure area onto which the pattern is projected; a magnification modification device that modifies the projection magnification of the projection optical system; a calculation device that calculates a shift length of the center of the projection area, associated with modification of the projection magnification; and, a correction device that corrects position information for the exposure area based on the shift length of the center of the projection area.

According to a second aspect of the invention, an exposure method is provided, having setting an optical center of a projection exposure system which projects a pattern of a mask onto a prescribed exposure area with a prescribed projection magnification and a center of the projection area onto which the pattern is projected, to differing positions, for exposure; modifying the projection magnification of the projection optical system; calculating a shift length of the center of the projection area associated with the projection magnification modification; and, correcting position information of the exposure area, based on the shift length of the center of the projection area.

According to the first or the second aspect, when there is a shift in the center of the projection area accompanying modification of the projection magnification, the shift length is calculated, and position information for the exposure area to be exposed to the pattern is corrected. For example, by correcting the position of the substrate used in exposure processing based on the shift length, the mask pattern is transferred onto a prescribed position on the substrate. As a result, installation of an image shift optical element and/or fluctuations in other aberrations are avoided. Further, repeated measurements of the baseline value upon each modification of the projection magnification are reduced, and a decline in throughput can be prevented.

According to a third aspect of the invention, a device manufacturing method is provided, having a lithography process, in which the above-described exposure method is used in the lithography process.

According to the third aspect, in the lithography process, for example declines in throughput can be prevented, and devices can be manufactured efficiently.

DETAILED DESCRIPTION OF THE INVENTION

Below, embodiments of an exposure apparatus, exposure method, and device manufacturing method of the invention are explained, referring to FIG. 1 through FIG. 7.

In the present embodiment, the invention is applied to a step-and-scan type projection exposure apparatus which uses a catadioptric system as the projection optical system.

Figure 1:
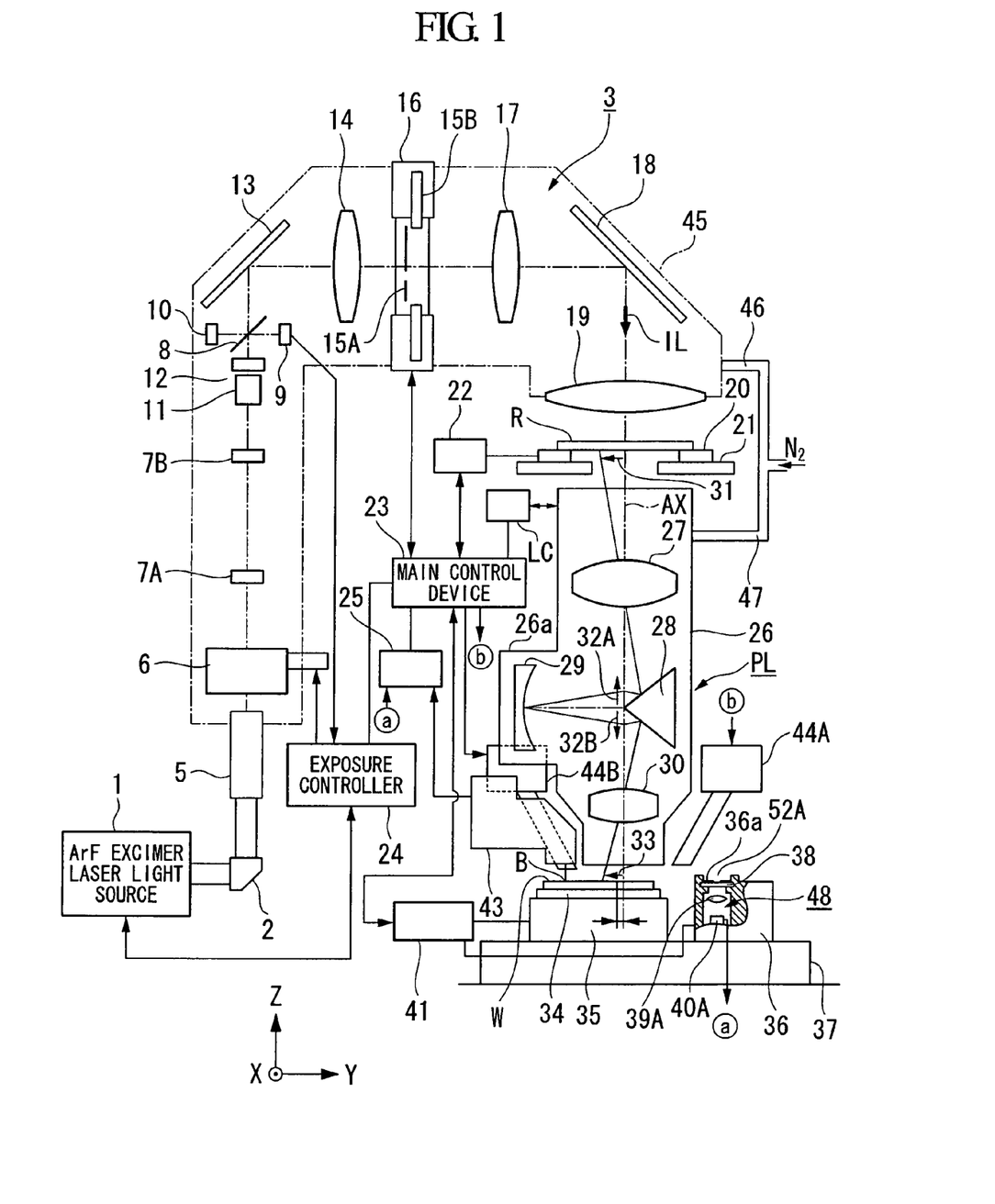
FIG. 1 is a schematic view showing the configuration of the projection exposure apparatus according to an embodiment.

FIG. 1 shows in summary the configuration of a projection exposure apparatus according to the embodiment; in FIG. 1, the chamber which houses the projection exposure apparatus is omitted. In FIG. 1, an ArF excimer laser light source 1 (oscillation wavelength 193 nm) is used as the exposure light source. As the exposure light source, lasers which emit laser light in the ultraviolet range in the oscillation step, such as a KrF excimer laser (wavelength 248 nm) or an $F_2$ laser (wavelength 157 nm), or devices emitting high-harmonic laser light substantially in the vacuum ultraviolet range, obtained by wavelength conversion of near-infrared laser light from a solid state laser light source (YAG laser, semiconductor laser, or similar), as well as a mercury discharge lamp often used in exposure equipment of this kind, or similar can be used.

In FIG. 1, exposure light IL (an exposure beam), which is a band-narrowed ultraviolet pulse light of wavelength 193 nm from the ArF excimer laser light source, passes through a beam-matching unit (BMU) 2, employing a movable mirror or similar, in order to match the beam to the position of the optical path with the projection exposure apparatus body, and then passes through a light-shielding pipe 5 and is incident on a variable attenuator 6 serving as an optical attenuator. An exposure controller 24, used to control the exposure amount for resist on the wafer, begins and stops exposure to light from the ArF excimer laser light source 1, controls the output as determined by the oscillation frequency and pulse energy, and also adjusts the attenuation ratio of exposure light in the variable attenuator 6, either continuously or in steps.

Exposure light IL which has passed through the variable attenuator 6 passes through a beam-shaping optical system, employing lens systems 7A and 7B positioned along a prescribed optical axis, and is incident on a fly-eye lens 11 serving as an optical integrator. The aperture diaphragm system 12 of the illumination system is positioned at the emission face of the fly-eye lens 11. In the aperture diaphragm system 12 are positioned, so as to enable free switching therebetween, a circular aperture diaphragm for normal illumination, an aperture diaphragm for off-axis illumination employing a plurality of small-size eccentric apertures, an aperture diaphragm for annular illumination, and similar. Exposure light IL emitted from the fly-eye lens 11 which has passed through a prescribed aperture diaphragm of the aperture diaphragm system 12 is incident on a beam splitter 8 with high transmittance and low reflectance. The ultraviolet pulse light reflected by the beam splitter 8 is incident on an integrator sensor employing a photodetector, and the detection signal of the integrator sensor 9 is supplied to the exposure controller 24. On the side of the beam splitter 8 opposite the integrator sensor 9 is positioned a reflection photodetection system 10. The reflection photodetection system 10 is a photodetector which detects reflected light of the exposure light IL reflected by the wafer W. The detection result of the reflection photodetection system 10 can be used to calculate the amount of light incident on the projection optical system PL due to reflection by the wafer W.

The transmittance and reflectance of the beam splitter 8 are measured with high precision in advance, and the values stored in memory within the exposure controller 24. The exposure controller 24 is configured so as to enable use of the detection signal of the integrator sensor 9 to monitor the amount of exposure light IL incident indirectly on the projection optical system PL, as well as the cumulative value thereof.

After passing through the beam splitter 8, the exposure light IL is reflected by a mirror 13 used to bend the optical path, and after passing through the condensing lens system 14 is incident on a fixed illumination field stop (fixed blind) 15A within the reticle blind mechanism 16. The fixed blind 15A has an aperture portion positioned so as to be extended, in a straight-line slit shape, an arc shape, or a rectangular shape (below, these are collectively called a "slit shape") in the non-scanning direction perpendicular to the scanning direction within the area substantially conjugate with the field of the projection optical system PL. Further, within the reticle blind mechanism 16 is provided, separately from the fixed blind 15A, a movable blind 15B, the width in the scanning direction of the illumination area of which is variable; by means of this movable blind 15B, the scanning movement stroke of the reticle stage can be reduced, and the width of the shielded region of the reticle R can be reduced. Aperture ratio information for the movable blind 15B is supplied to the exposure controller 24. The product of the amount of incident light determined from the detection signal of the integrator sensor 9 and the aperture ratio is the actual amount of light incident on the projection optical system PL. The main control device 23 provides the lens controller LC (magnification modification device) with the projection magnification and image-forming position (focal point position) in the optical axis direction of the projection optical system PL, distortion, and other correction instructions, based on information relating to the detection signals of the integrator sensor 9 and reflection photodetection system 10, the aperture ratio of the movable blind 15B, and other information. The lens controller LC drives the correction optical system (described below) of the projection optical system according to these instructions, to execute correction for projection magnification and other phenomena.

Having been shaped into a slit shape by the fixed blind 15A of the reticle blind mechanism 16, the exposure light IL passes through the image-forming lens system 17, mirror 18 to bend the optical path, and the main condensing lens system 19, and illuminates, with a uniform intensity distribution, an illumination area 31, similar in shape to the slit-shape aperture portion of the fixed blind 15A, in the circuit pattern area of the reticle R serving as a mask. That is, the plane position of the aperture portion of the fixed blind 15A, or of the aperture portion of the movable blind 15B, is substantially conjugate to the pattern plane of the reticle R with respect to the composite system of the image-forming lens system 17 and the main condensing lens system 19. The illumination optical system 3 is formed from members from the variable attenuator 6 to the main condensing lens system 19. The illumination optical system 3 is housed within a subchamber 45. Ordinary air has a high optical absorptivity for the ArF excimer laser light used as the exposure light IL in this embodiment. Hence nitrogen gas ($N_2$), which is the gas through which the exposure light IL passes (a gas with a low absorptivity for the exposure light IL), is supplied to the subchamber 45 via a pipe 46. In place of nitrogen gas, dry air, helium, or another inert gas can also be used.

Of the circuit pattern area formed on the reticle R, the image of the portion within the illumination area 31 illuminated by the exposure light IL is projected to form an image on the projection area 33 on the wafer W coated with photoresist as the substrate (sensitive substrate), via the reducing projection optical system PL, telecentric on both sides (or on one side), with projection magnification β. As one example, the projection magnification of the projection optical system PL may be ¼.

The projection optical system PL of this embodiment is a catadioptric system; an example of a detailed configuration is for example disclosed in PCT International Publication No. WO 01/065296 (corresponding to U.S. Patent Application, Publication No. 2003/0011755 A1). In the following explanation, the Z axis is set parallel to the optical axis AX of the projection optical system PL, and in the plane perpendicular to the Z axis, the X axis is set in the direction perpendicular to the plane of the paper in FIG. 1, and the Y axis is set in the direction parallel to the plane of the paper in FIG. 1. In this embodiment, the −Z direction is substantially the downward vertical direction, and the XY plane is substantially parallel to the horizontal plane; the direction along the Y axis (the Y direction) is the scanning direction of the reticle R and wafer W during scanning exposure. The illumination-area 31 on the reticle R and the projection area 33 on the wafer W conjugate therewith have long thin shapes, the long axes of which are both in the direction along the X axis (the X direction), which is a non-scanning direction.

As shown in simplified form in FIG. 1, the projection optical system PL has a first refractive optical system 27, reflective optical element 28, concave mirror 29, second refractive optical system 30, and lens barrel 26 within which these are positioned. The first refractive optical system 27 forms a reduced image 32A of the pattern on the reticle R within the illumination area 31. The reflective optical element 28 has a first reflective face, which bends the beam from the first refractive optical system 27 substantially in the −Y direction, and a second reflective face, which bends the beam from the concave mirror 29, described below, substantially in the −Z direction. The concave mirror 29 reflects the beam from the reflective optical element 28 toward the reflective optical element 28 and forms the image 32B. The second refractive optical system 30 condenses the beam reflected substantially in the −Z direction by the reflective optical element 28 via the image 32B, and forms a reduced image of the image 32B in the projection area 33 on the wafer W. Further, the projection optical system PL has a correcting optical system, not shown, which performs fine adjustment of the projection magnification, focus position, distortion, and similar. The optical axes of the refractive optical systems 27 and 30 coincide with the optical axis AX. The optical axes of the reflective optical element 28 and concave mirror 29 are parallel to the Y axis. The direction (sense) of the pattern in the illumination area 31 and that of the image in the projection area 33 are the same. The reflective optical element 28 and the concave mirror 29 are opposed, with the reflective optical element 28 positioned on the +Y direction side, and the concave mirror 29 positioned on the −Y direction side. A portion 26a of the end face on the −Y direction side of the lens barrel 26 protrudes outward.

In this configuration, the beam incident on the concave mirror 29 which forms the image 32A and the beam reflected by the concave mirror 29 which forms the image 32B are separated in the Z direction. The center of the illumination area 31 on the reticle R is shifted in the −Y direction with respect to the optical axis AX. The center of the projection area 33 on the wafer W is also shifted in the −Y direction (corresponding to the prescribed direction of the invention; in this embodiment, parallel to the scanning direction) with respect to the optical axis AX. As one example, if the Y-direction width of the projection area 33 (slit width) is 5 to 10 mm, then the shift length $\Delta Y$ is a length greater which exceeds by a certain level (for example, approximately 1 mm) about ½ the slit width. Nitrogen gas, or else helium or another inert gas, which is a gas which transmits the exposure light IL (a gas with low absorptivity for the exposure light IL), is also supplied to the interior of the lens barrel 26 of the projection optical system PL via the pipe 47.

As the projection optical system PL, the catadioptric system disclosed in Japanese Unexamined Patent Application, Publication No. 2000-47114 (corresponding to U.S. Pat. No. 6,496,306), can also be applied to this invention.

Next, the stage system and alignment system of the projection exposure apparatus of this embodiment are explained.

At the time of scanning exposure, the reticle R positioned on the object-plane side of the projection optical system PL is suction-held on the reticle stage 20, which moves at constant speed at least in the Y direction on the reticle base 21 with an air bearing intervening. The movement coordinate positions (X-direction and Y-direction positions, and rotation angle about the Z axis) of the reticle stage 20 are iteratively measured by a reticle interferometer system (not shown), having movement mirrors (not shown) fixed to the reticle stage 20 and a plurality of laser interferometers positioned in opposition thereto. Movement of the reticle stage 20 is controlled by a driving system 22 having a linear motor, fine-movement actuator and similar. The reticle interferometer system in actuality is provided with a three-axis laser interferometer having one optical axis in the X direction and two optical axes in the Y direction. Measurement information of the reticle interferometer system is supplied to a stage control portion and supervisory control portion within the main control device 23, which performs supervisory control of operation of the entire device. The stage control portion controls operation of the driving system 22 based on this measurement information and on control information (input information) from the supervisory control portion.

On the other hand, the wafer W positioned on the image-plane side of the projection optical system PL is suction-held onto the wafer stage 35 with the wafer holder 34 intervening. The wafer stage 35 is placed on the wafer base 37, with an air bearing intervening, so as to enable movement at constant velocity in at least the Y direction at the time of scanning exposure, as well as step movement in the X direction and Y direction. The wafer stage 35 is provided with a Z leveling mechanism, which controls the Z-direction position (focus position) and the angles of inclination about the X axis and Y axis of the wafer W, based on measured values of a multi-point autofocus sensor (not shown). The autofocus sensor measures focus positions at a plurality of measurement points within a prescribed area, including the projection area 33. The focus detection system detects plane position information for the substrate by measuring the Z-axis direction position information of the substrate at each of the plurality of measurement points, as for example disclosed in U.S. Pat. No. 6,608,681.

An off-axis type FIA (Field Image Alignment) alignment sensor 43 is positioned on the −Y-direction side of the projection optical system PL, that is, near the side in the direction of shift of the center position of the projection area 33 from the optical axis AX. The alignment sensor 43 uses broad-band illumination light guided by for example a light guide (not shown) or similar to illuminate a detection mark, and supplies image signals corresponding to detection mark images and images of internal index marks to the alignment processing system 25. An example of the detailed configuration of an FIA type alignment sensor is for example disclosed in Japanese Unexamined Patent Application, Publication No. H07-183186. Movement coordinate information for the wafer stage 35 and for a measurement stage 36, described below, is also supplied to the alignment processing system 25. In the alignment processing system 25, image processing of the image signals is performed, the position shift lengths in the X direction and Y direction of the center of the index mark image relative to the center of the detection mark image are determined, and by adding these position shift lengths to the stage movement coordinates at that time, the X direction and Y direction coordinates of the detection mark are calculated. In this case, within the field of the alignment sensor 43, the center B of the conjugate image of the index mark is the detection center (the position at which the position shift lengths measured for the detection mark are (0,0)) of the alignment sensor 43.

Figure 2:
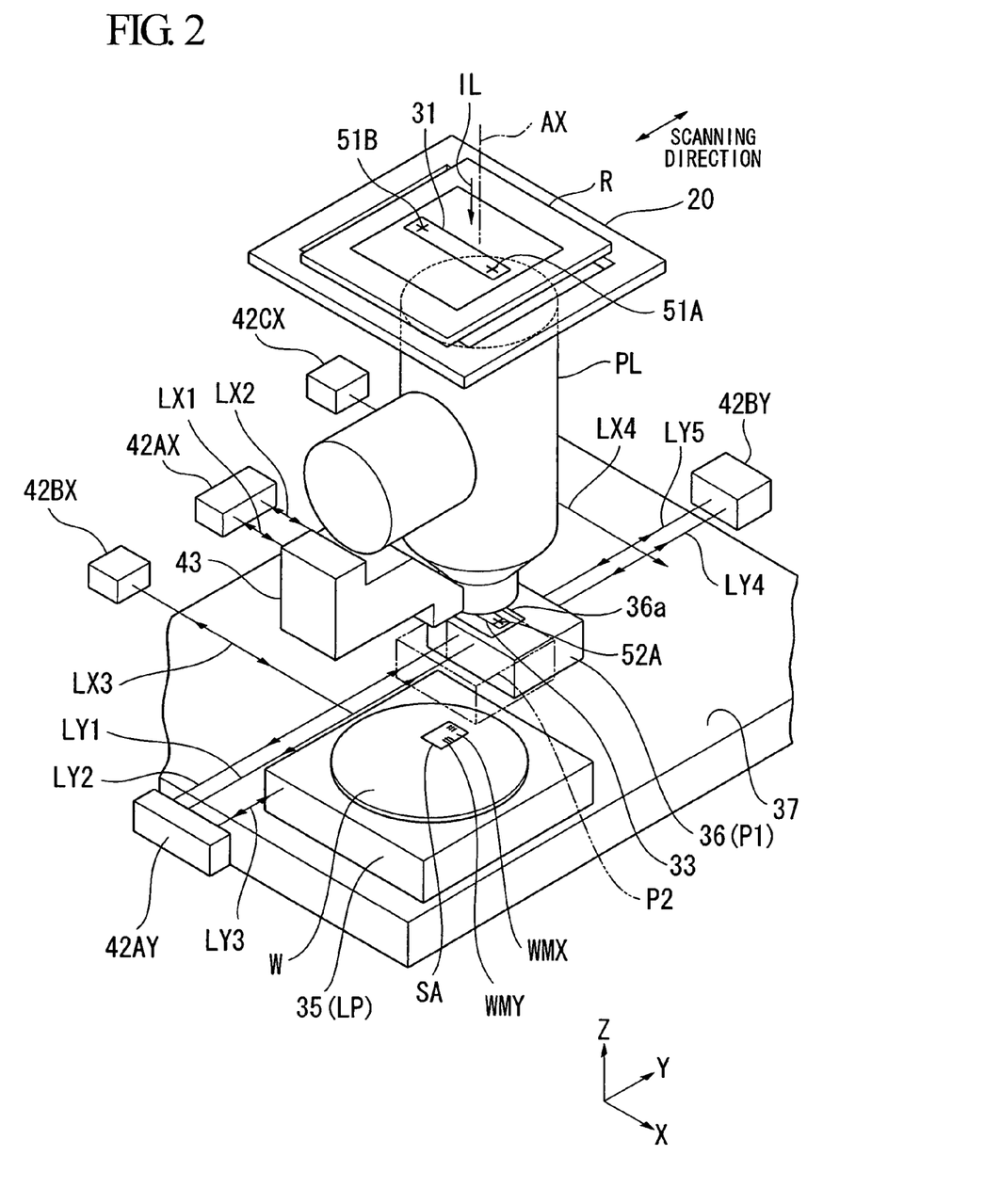
FIG. 2 is a perspective view showing in summary the configuration of a projection exposure apparatus.

FIG. 2 shows the positional relation between the stage system, projection optical system PL, and alignment sensor 43 in FIG. 1. In FIG. 2, numerous shot areas SA (exposure areas; in FIG. 2, a single representative shot area is shown) are set on the upper face of the wafer W by division at a prescribed pitch in the X direction and Y direction. In each shot area SA, an X-axis wafer mark WMX and a Y-axis wafer mark WMY are provided as alignment marks. By measuring the coordinates of prescribed wafer marks on the wafer W using the alignment sensor 43, alignment of the wafer W is performed.

As one example, in the alignment processing system 25, the array coordinates of all shot areas on the wafer W are calculated using an enhanced global alignment (EGA) method, through statistical processing of the coordinates of a plurality of wafer marks at prescribed positions on the wafer W. And as described below, the baseline value, which is the interval between the detection center B of the alignment sensor 43 and the exposure center (normally substantially equal to the center of the projection area 33), is measured in advance. Baseline value information is stored within the alignment processing system 25. In the alignment processing system 25, array coordinate information, determined by correcting all the shot areas on the wafer W by the baseline value, is supplied to the supervisory control portion within the main control device 23.

In FIG. 1, a measurement stage 36 is placed on the wafer base 37 independently of the wafer stage 35 (exposure stage), with an air bearing or similar intervening, so as to enable free movement in the X direction and Y direction. The measurement stage 36 is used when performing reticle alignment and baseline value (positional relationship between the projection area 33 and the alignment sensor 43) measurement, and when measuring the amount of illumination of exposure light IL. A reference mark plate 38, on which are formed prescribed reference marks, is fixed to the upper face of the measurement stage 36. The spatial image measurement system 48, including the reference mark plate 38, is incorporated into the measurement stage 36. An example of the detailed configuration of a spatial image measurement system 48 is described in Japanese Unexamined Patent Application, Publication No. 2002-14005 (corresponding to U.S. Patent Application, Publication No. 2002/0041377). An illumination amount sensor (not shown) for measurement of the illumination amount is also incorporated into the measurement stage 36. The upper face of the reference mark plate 38 is set to the same height as the image plane of the projection optical system PL. As explained below, the projection exposure apparatus of this embodiment is a liquid immersion-type device, and an area of the upper face of the reference mark plate 38 enclosed by a rectangular frame is a liquid immersion area 36a to which liquid is supplied.

The wafer stage 35 and measurement stage 36 are each configured so as to be driven in the X direction by a linear motor along X-axis guides, not shown, and the X-axis guides are driven in the Y direction by a spindle motor along Y-axis guides, not shown. The driving mechanisms including these linear motors are shown as the driving system 41. The measurement stage 36 and driving system 41 correspond to the measurement mechanism which measures the positional relation between the projection area and the alignment system. In order for the stage control portion within the main control device 23 to control operation of the driving system 41, it is necessary to measure the movement coordinate positions (positions in the X direction and Y direction, and rotation angle about the Z axis and similar) of the wafer stage 35 and measurement stage 36. To this end, movement mirrors (not shown) which are planar mirrors are fixed on the sides in the −X direction and in the −Y direction of the wafer stage 35, and movement mirrors (not shown) which are planar mirrors are also fixed on the sides in the −X direction, in the +Y direction, and in the −Y direction of the measurement stage 36. However, in place of movement mirrors, mirror-finished side faces of each stage may be used as movement mirrors.

FIG. 2 shows a wafer interferometer system used to measure movement coordinate positions of the wafer stage 35 and measurement stage 36. In FIG. 2, a measurement stage 36 is positioned below the projection optical system PL in order to perform alignment of the reticle R and measurements of baseline values; the wafer stage 35 is positioned in a wafer loading position LP at the end portion on the wafer base 37 in the +X direction and −Y direction. When the wafer stage 35 is moved below the projection optical system PL in order to perform exposure of the wafer W, the measurement stage 36 is moved to an evacuation position in the +Y direction.

In FIG. 2, a laser interferometer 42AX is positioned in the center above the edge portion in the −X direction of the wafer base 37 for use in X coordinate measurement, and the laser interferometers 42BX and 42CX are positioned so as to enclose this in the Y direction. The center laser interferometer 42AX emits two-axis measurement beams LX1 and LX2, separated by a prescribed distance in the Y direction, in the +X direction. The laser interferometer 42BC emits the measurement beam LX3 in the +X direction. The laser interferometer 42CX emits the measurement beam LX4 in the +X direction. In this case, the straight line which is an extension of the measurement beam LX1 passes through the center of the projection area 33 and is substantially perpendicular to a straight line parallel to the Z axis. The center laser interferometer 42AX measures the X coordinate, and the rotation angle θZ1 about the Z axis, of the wafer stage 35 or measurement stage 36 positioned below the projection optical system PL. The laser interferometers 42BX and 42CX measure the X coordinates of the wafer stage 35 when moved to the −Y direction loading position LP and of the measurement stage 36 when moved to the +Y direction evacuation position, respectively.

For Y coordinate measurement, interferometers 42AY and 42BY are positioned above the edge portions in the −Y direction and in the +Y direction of the wafer base 37. The laser interferometer 42AY emits two-axis measurement beams LY1 and LY2, separated by a prescribed distance in the X direction, in the +Y direction, and emits a single-axis measurement beam LY3 in the +Y direction toward the wafer stage 35. The laser interferometer 42BY emits two-axis measurement beams LY4 and LY5 in the −Y direction toward the measurement stage 36. The straight line passing through the centers of the two-axis measurement beams LY1 and LY2, and the straight line passing through the centers of the two-axis measurement beams LY4 and LY5, each pass through the center of the projection area 33 and substantially intersect a straight line parallel to the Z axis. By means of the measurement beams LY1 and LY2, the Y coordinate and the rotation angle θZ2 about the Z axis of the wafer stage 35 or the measurement stage 36 positioned below the projection optical system PL are measured. By means of the measurement beam LY3, the Y coordinate of the wafer stage 35 at the loading position LP is measured. And by means of the measurement beams LY4 and LY5, the Y coordinate and the rotation angle θZ3 about the Z axis of the evacuated measurement stage 36 are measured.

In this configuration, as one example, the average value of the rotation angles θZ1 and θZ2 about the Z axis measured by the laser interferometers 42AX and 42AY is used as the rotation angle about the Z axis of the stage for measurement. The laser interferometers 42AX and 42AY in actuality also emit measurement beams for use in measuring rotation angles about the Y axis and X axis. A wafer interferometer system is configured from the X-axis laser interferometers 42AX, 42BX, 42CX and from the Y-axis laser interferometers 42AY, 42BY in FIG. 2. Measurement information of the wafer interferometer system is supplied to the stage control portion and supervisory control portion within the main control device 23. The stage control portion controls operation of the driving system 41, based on this measurement information and on control information from the supervisory control portion. Measurement information of the X-axis laser interferometer 42AX and Y-axis laser interferometer 42AY is also supplied to the alignment processing system 25 of FIG. 1.

The projection exposure apparatus of this embodiment is a liquid-immersion type device. A pair of liquid supply/recovery devices 44A and 44B (liquid supply mechanisms), which supply pure water or another liquid between the projection optical system PL and the wafer W (or reference mark plate 38), are positioned so as to enclose the projection optical system PL in the scanning direction. During scanning exposure and during alignment of the reticle R, liquid is supplied from the liquid supply/recovery devices 44A and 44B to the space between the projection optical system PL and the opposing object. By this means, the resolving power and depth of focus are improved. The detailed configuration of the liquid supply/recovery devices 44A and 44B is for example disclosed in PCT International Publication No. WO 00/49504.

In this embodiment, the stage control portion in the main control device 23 of FIG. 1 is provided with a reticle-side control portion, which optimally controls the driving system 22 based on measurement information of the reticle interferometer system, and a wafer-side control portion, which optimally controls the driving system 41 based on measurement information of the wafer interferometer system of FIG. 2. When simultaneously scanning the reticle R and wafer W during scanning exposure, both the control portions execute coordinated control of the driving systems 22 and 41.

Figure 3A:
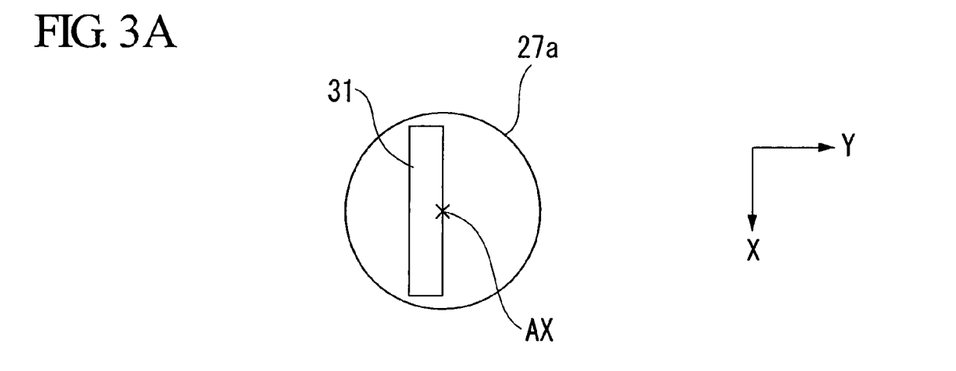
FIG. 3A shows an illuminated area on the reticle of FIG. 2.
Figure 3B:
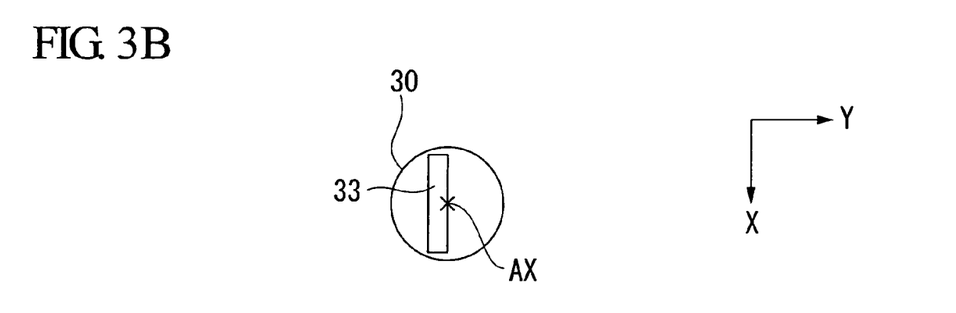
FIG. 3B shows a shot area on the wafer of FIG. 2.

Next, the positional relation between the illumination area 31 on the reticle R of FIG. 2 and the projection area 33 on the wafer W is explained, referring to FIG. 3A and FIG. 3B. FIG. 3A shows the illumination area 31 on the reticle R of FIG. 2. In FIG. 3A, the rectangular illumination area 31, which is long in the X direction, is set at a position shifted slightly in the −Y direction with respect to the optical axis AX within the circular illumination field 27a on the reticle R of the projection optical system PL. The short-edge direction of the illumination area 31 (the Y direction) coincides with the scanning direction of the reticle R. That is, the illumination area 31 has a long axis extending in the X direction and a short axis extending in the Y direction. On the other hand, FIG. 3B shows a shot area SA (an area conjugate with the illumination area 31) on the wafer W of FIG. 2. In FIG. 3B, the projection area 33, which is long in the X direction, is set at a position shifted slightly in the −Y direction with respect to the optical axis AX within the circular effective exposure field 30a of the second objective portion 52 (reducing projection system) of the projection optical system PL of FIG. 2.

In the above exposure apparatus, under control by the main control device 23, measurements to prepare for exposure are initially performed. That is, preparatory tasks are performed such as reticle alignment of the reticle R on the reticle stage 20 and measurement of the baseline value using the alignment sensor 43. This baseline value is the interval between the detection center of the alignment sensor 43 (the center of the image of the index mark projected onto the wafer W) and the center of the reticle R (approximated by the optical axis AX1), and becomes a reference value when feeding the wafer W, measured by the alignment sensor 43, into the projection area of the projection optical system PL.

When exposure of the wafer W includes exposure of a second and subsequent layers, in order to form circuit patterns with good precision superposed on previously formed circuit patterns, EGA measurements (so-called Enhanced Global Alignment, disclosed in for example Japanese Unexamined Patent Application, Publication No. S61-44429) using the alignment sensor (substrate measurement device) 43 can be employed to detect the shot area array coordinates on the wafer W with high precision.

The operation to expose the wafer W is performed by the main control device 23 by repeating, in step-and-scan fashion, a shot-to-shot movement operation in which the wafer stage 35 is moved to the scanning start position (acceleration start position) for exposure of each shot area on the wafer W, based on the results of Enhanced Global Alignment (EGA) or other wafer alignment performed in advance and on the latest results of baseline measurements by the alignment sensor 43, and a scanning exposure operation in which the pattern formed on the reticle R is transferred by a scanning exposure method to each shot area.

When such scanning exposure is continued, the reticle R undergoes expansion/contraction or deformation due to the irradiation heat of the illumination light (exposure light IL), and as a consequence the magnification of the projected image projected onto the wafer W gradually changes, so that there is the possibility that exposure of the target projected image may no longer be performed. For this reason, the projection magnification is corrected. In this case, the image center of the projection area 33 shifts accompanying changes in the projection magnification, and so it is necessary to correct the position of the wafer W (positions of shot areas SA) to conform to the position of the shifted projection area 33.

Similarly, when image-forming characteristics including the projection magnification are adjusted based on the results of the above-described EGA measurements, and when a wafer having a plurality of shot areas onto which a pattern has been transferred is subjected to measurements using a superposed instrument or similar, even when the pattern is superposed on the wafer with the projection magnification modified based on measurement results for each shot area, the image center of the projection area 33 may shift accompanying changes in the projection magnification. As a result, the position of the wafer W (positions of shot areas SA) must be corrected to conform to the position of the shifted projection area 33.

Below, each of these cases is described in detail.

<Correction Accompanying Expansion/Contraction of Reticle R>

Here, the procedure to determine the expansion/contraction (thermal deformation) of the reticle R is first explained.

The method to calculate the amount of expansion/contraction (deformation amount) of the reticle R is for example described in detail in Japanese Unexamined Patent Application, Publication No. H11-195602, and so here a simple explanation is given.

Reticle expansion/contraction is calculated by measuring the amount of irradiation of illumination light (exposure light IL). Specifically, reticle expansion/contraction occurs depending on the temperature distribution of the reticle R, and so in order to calculate the thermal deformation amount, the temperature distribution in the reticle R at a certain time is determined. In a method for calculating this temperature distribution, the reticle R is partitioned into prescribed finite elements and determines the temperature changes at each point by use of a difference calculus method, or a finite element method, or similar.

Figure 4:
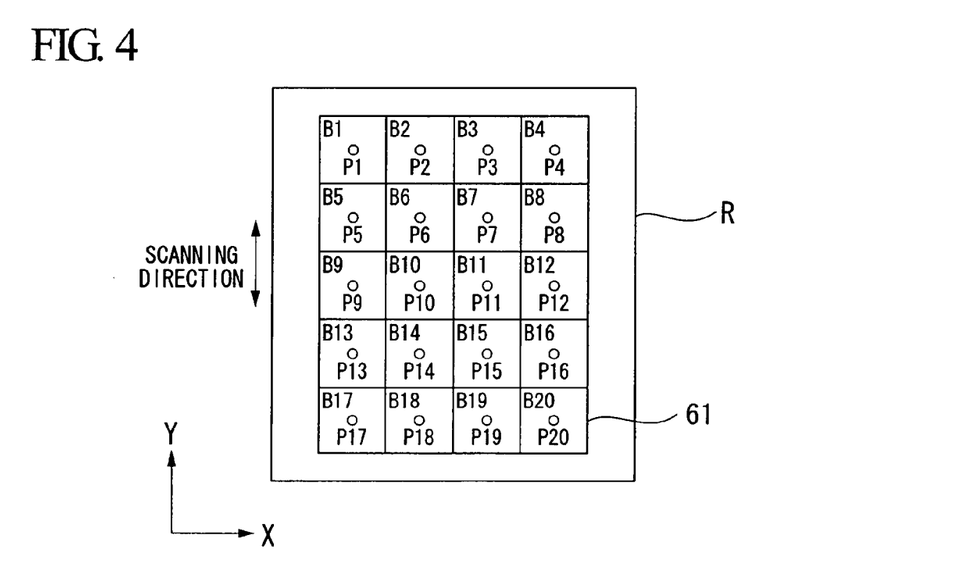
FIG. 4 shows a state of division of the pattern area of a reticle.

FIG. 4 shows a state in which the pattern area 61 of the reticle R is partitioned into five divisions in the scanning direction (Y direction) and four divisions into the non-scanning direction (X direction), that is, into 5×4 or 20 blocks. In FIG. 4, the partitioned blocks are labeled blocks B1 to B20, and the center point of each block B1 to B20 is P1 to P20. The number of partitions, and selection of the calculation method, are ultimately determined according to the required precision, the speed of computer calculation, and other factors; in this embodiment, for convenience, the pattern area 61 was partitioned into 20 blocks.

Even when blocks B1 to B20 of the reticle R are illuminated with uniform radiation, the heat amount absorbed by the reticle R will be different among the blocks B1 to B20 due to the distribution of the pattern existence ratio. For this reason, the pattern existence ratio must be determined for the blocks B1 to B20 on the reticle R. However, the amount of heat absorbed is assumed to be uniform within each block.

The pattern existence ratio within each of the blocks B1 to B20 is determined from the ratio of the detection result of the integrator sensor 9 shown in FIG. 1 and the detection result of an irradiation amount sensor (not shown) provided on the measurement stage 36. To this end, first a reticle of the same shape as the reticle R of FIG. 4, but with no pattern whatsoever drawn thereupon (a test reticle), is positioned such that the center in the scanning direction of blocks B1 to B4 substantially coincides with the center of the illumination area 31 of exposure light IL. Next, the measurement stage 36 shown in FIG. 1 is moved, and the center of the irradiation amount sensor is fed to substantially the center of the projection area 33 of the projection optical system PL. Then, the amount of irradiation of exposure light arriving at the irradiation amount sensor via the test reticle and similar is measured.

Then, the shape of the aperture portion of the movable blind 15B is modified, such that only block B1 is illuminated, and the output of the reflection photodetection system 10 is measured. At the same time, the output of the integrator sensor 9 is also measured. Thereafter, the shape of the aperture portion of the movable blind 15B is changed, and the blocks B2 through B4 are each illuminated in succession, and with each of the blocks B2 through B4 illuminated, the outputs of the reflection photodetection system 10 and integrator sensor 9 are measured. Then, the reticle stage 20 is driven, the center of the next row of blocks B5 through B8 in FIG. 4 is positioned near the center of the illumination area of exposure light, each of the blocks B5 through B8 is illuminated in succession by means of the movable blind 15B, and the outputs of the reflection photodetection system 10 and integrator sensor 9 are measured. Similar measurements are performed for the subsequent rows of blocks B9 through B12, B13 through B16, and B17 through B20.

Next, measurements similar to those described above for the test reticle are performed for the reticle R on which the actual exposure pattern is drawn, and the outputs from the irradiation amount sensor and integrator sensor 9 are measured for each of the blocks B1 through B20. Then, based on the ratio of the output from the irradiation amount sensor and the output from the integrator sensor 9 for the test reticle without a pattern drawn, and the ratio of the irradiation amount sensor output to the output of the integrator sensor 9 for the reticle R with a pattern drawn, the pattern existence ratios are determined for each of the blocks B1 to B20 on the reticle R. In this embodiment, during pattern existence ratio measurements, a test reticle with no patterns at all drawn was used; however the output ratio of the irradiation amount sensor and the integrator sensor 9 in a state in which there is no reticle R on the reticle stage 20 may also be determined. In this case, because there is no need to prepare a test reticle, there are the advantages that throughput of the exposure process is improved and manufacturing costs are further reduced.

Next, thermal absorption amounts are calculated for each block, based on the pattern existence ratios for each of the blocks B1 through B20. In each block, the amount of heat absorbed is in proportion to the illuminance of illumination light (exposure light IL) (proportional to the power of the excimer laser light source 1) and to the patter existence ratio. The absorbed heat moves to the air or to the reticle stage 20 through radiation and diffusion. Movement of heat between blocks also occurs. Hence the main control device 23 uses the pattern existence ratio for each block, illuminance of illumination light (exposure light IL) (corresponding to the output from the integrator sensor 9), temperature of the air in the exposure apparatus, temperature of the reticle stage 20, and similar to calculate the temperature distribution in the reticle R using a prescribed formula.

The main control device 23 determines the changes in distances between the center points P1 through P20 of the blocks B1 through B20 from the temperature distribution thus determined and the linear expansion coefficient of the reticle R (formed from, for example, quartz glass), and determines the displacement of each point on the reticle R (that is, expansion/contraction amounts) as an expansion measurement device.

Figure 5:
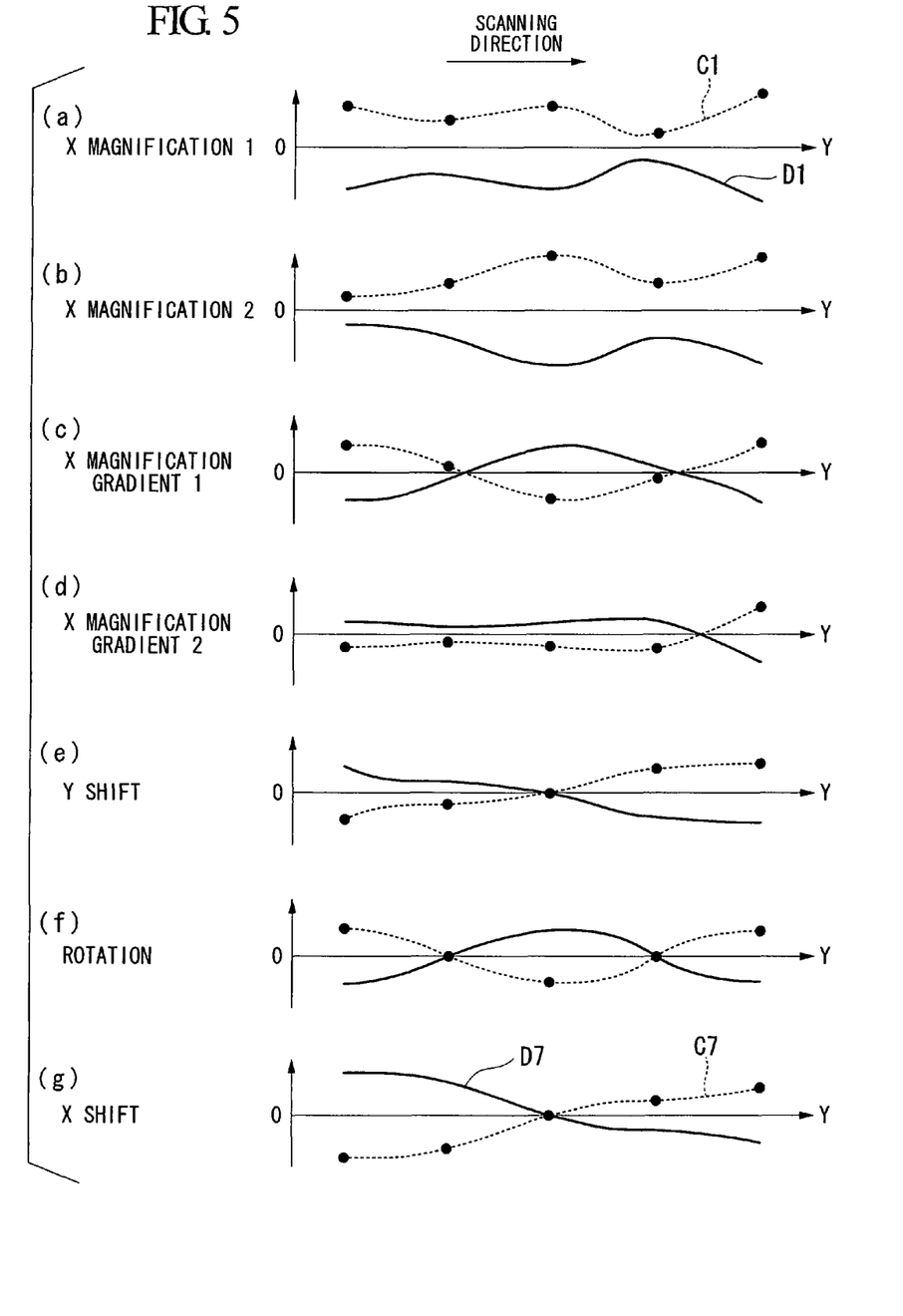
FIG. 5 shows an example of the relation between the reticle Y coordinate and each of the components of the analyzed thermal deformation, and the correction value corresponding thereto.

Next, the movement amounts of the center points P1 to P20 of each of the blocks B1 to B20 in the reticle R, determined as above, are analyzed into components. FIG. 5 shows an example of the relation between the Y coordinates of the reticle R and the components of analyzed thermal deformation amounts, and corresponding correction values. In part (a) through part (g) of FIG. 5, the horizontal axis indicates the position (Y coordinate) in the scanning direction of the reticle R, and the vertical axis indicates the thermal deformation amounts of the reticle R at the Y coordinate, or the correction values. The dashed-line curves C1 to C7 represent calculated values of the respective deformation amounts, and the solid-line curves D1 to D7 represent the respective corresponding correction values. The X magnification 1 in part (a) in FIG. 5 is the amount of magnification change calculated from the movement amount from the outside center points P1 and P4 in FIG. 4 in the X direction. The X magnification 2 in part (b) of FIG. 5 is the amount of magnification change calculated from the movement amounts in the X direction of the inside center points P2 and P3. The X magnification gradient 1 in part (c) of FIG. 5 is a value calculated from the difference in movement amounts in the X direction of the outside center points P1 and P4. And the X magnification gradient 2 in part (d) of FIG. 5 is a value calculated from the difference in movement amounts in the X direction of the inside center points P2 and P3.

When there is eccentricity in the distribution of the pattern existence ratio for the reticle R, so that for example the pattern existence ratio is high in blocks B1 and B2 and is low in blocks B3 and B4, the thermal deformation amount for the reticle R will be larger for blocks B3 and B4, and a bias will appear in the X-direction magnification. The Y shift in part (e) of FIG. 5 indicates the amount of average movement in the Y direction of the center points P1 to P4 in FIG. 4. Rotation in part (f) of FIG. 5 indicates the rotation angle determined by linear approximation of the relation between the Y-direction movement amounts of the center points P1 to P4 and each image height. The X shift in part (g) of FIG. 5 indicates the average X-direction movement amounts of the center points P1 to P4. Each of the above-described components is calculated each time the reticle R is moved sequentially in calculations a prescribed step amount in the Y direction.

Next, each of the components determined is represented as a function of the Y coordinate using prescribed formulae.

Each of the components expressed as a function of these image-forming characteristics is stored in a storage portion in the main control device 23. The main control device 23 may, as one example, modify the magnification of the projection optical system PL through the lens controller LC such that each of the stored components is cancelled.

When modifying the projection magnification in this way, because the center of the reticle R (the optical axis AX1 of the projection optical system PL) and the center of the projection area 33 of the projection optical system PL are different, there is the possibility of occurrence of an image shift, in which the position of the projection area 33 is shifted somewhat. In this case, the main control device 23, as a calculation device, calculates the amount of shift of the center of the projection area 33 accompanying the modification of the projection magnification. Based on this calculated shift length, the stage control portion (correction device) within the main control device 23 uses the driving system 41 to control the wafer stage 35, to correct the position of the wafer W in both the X direction and the Y direction.

Below, correction in the X direction and Y direction is explained.

<X-direction Correction>

Let the change in magnification in the X direction be ΔX, and the above-described eccentricity in the center be "k". The main control device 23 calculates the image shift length S using the following equation.

$$S = k \times \Delta X \quad (1)$$

The stage control portion, as a position control device, positions the position of a shot area SA on the wafer W, set in advance, to an X-direction position corrected for the image shift length S calculated using the above equation (1).

At this time, the X shift length (correction value) is controlled according to the Y coordinate such that, when blocks B1 to B4 of the reticle R are being illuminated, the X shift lengths of the center points P1 to P4 of blocks B1 to B4 relative to the illumination area are shift lengths at the illumination area center.

Instead of correcting X-direction positions in realtime during exposure processing, as described above, a procedure may be used in which image shift lengths are corrected at each shot. In this case, a configuration may be used in which, when for example using the above baseline value to position a shot area SA on the wafer W in the projection area 33, positioning is performed using a driving amount obtained by adding the image shift length to the baseline value, or using the baseline value corrected by the image shift length to feed the wafer.

<Y-direction Correction>

When correcting the image shift length in the Y direction, which is the scanning direction, the relative speeds of the reticle R and wafer W are modified according to the Y coordinate of the reticle R. Specifically, the Y shift length according to the Y coordinate is determined as described above, and the scanning speed of the reticle R (ratio of the speeds of the reticle and wafer, synchronous movement speed) is modified to perform correction such that the Y shift length corresponding to the Y coordinate is cancelled.

For example, when a Y shift occurs such that the reticle R expands in the Y direction due absorption of illumination light, the scanning speed of the wafer W (wafer stage 35) is reduced, and in the opposite case, the scanning speed of the wafer W (wafer stage 35) is increased.

When correcting the rotation component in part (f) of FIG. 5, correction can be performed by modifying the relative rotation amounts of the reticle R and wafer W. That is, either the reticle R is rotated via the reticle stage 20, or the wafer W is rotated in the θZ direction (the direction of rotation about the Z axis) via the wafer stage 35.

When the projection magnification is modified in this way to correct for expansion/contraction of the reticle, exposure processing can be performed correcting for the image shift length.

<Correction Accompanying EGA Measurements>

As described above, when exposure of the wafer W is exposure of a second or subsequent layer, in order to form circuit patterns superimposed on the previously formed circuit patterns with high precision, the alignment sensor 43 is used to perform EGA measurements in which wafer marks (substrate marks), not shown, on the wafer W are measured. Together with array coordinates of shot areas on the wafer W, the main control device 23 also determines the magnification correction value. The main control device 23 modifies the magnification of the projection optical system PL through the lens controller LC so as to implement the magnification correction value thus determined.

Because an image shift similar to that resulting from reticle expansion/contraction occurs accompanying this modification of the magnification, in this embodiment the main control device 23, as a calculating device, first calculates the image shift length S using the above equation (1). Also, the main control device 23 issues an instruction to the stage control portion, and corrects the image shift length in the X direction by adjusting the position of the wafer W (wafer stage 35). In this case, when the above baseline value is used to position a shot area SA of the wafer W in the projection area 33, positioning may be performed using a driving amount obtained by adding the image shift length to the baseline value, or the wafer may be fed using the baseline value corrected by the image shift length.

With respect to the Y-direction image shift length also, the main control device 23 performs correction through scanning speed adjustment of the wafer W (wafer stage 35), similarly to the case of reticle expansion/contraction. Correction of the rotation direction component is likewise similar to that for reticle expansion/contraction.

In this way, when the projection magnification is modified based on EGA measurements also, exposure processing can be performed with the image shift length corrected.

Corrections accompanying these EGA measurements are performed each time EGA measurements are performed.

<Correction Accompanying Measurement of All Shot Areas>

In corrections accompanying the above EGA measurements, a procedure was employed in which wafer marks are measured for shot areas for which EGA measurements are performed among a plurality of shot areas; however, this invention can also be applied to cases in which the projection magnification is modified when adopting a procedure of measuring the wafer marks for all shot areas, and superposing a pattern based on the measurement results.

For example, as described in Japanese Unexamined Patent Application, Publication No. 2001-345243, a wafer earlier than the nth wafer (n≧2) in a lot is subjected to detection of all shot area positions, separation of each position shift length into nonlinear components and linear components, and evaluation of nonlinear strain in the wafer using the position shift lengths and a prescribed evaluation function, so that the nonlinear components of position shift lengths for all shots are calculated based on an interpolation function derived from the evaluation results. On the other hand, for the nth and subsequent wafers, position coordinates are calculated for all shots with the linear components of position shift lengths corrected through EGA measurements, and based on the position coordinates of all shots corrected for the linear components and the nonlinear components calculated above, shot positions are superposed on the detected pattern. When using such a procedure, this invention can be applied when modifying the projection magnification.

Or, as described in Japanese Unexamined Patent Application, Publication No. 2002-353121, superpositioning error can be measured for all shot areas on a reference wafer using a superpositioning measurement instrument or similar, for a plurality of conditions related to the substrate. By this means, a correction map is prepared in advance to correct the nonlinear components of position shift lengths relative to design values for each of the plurality of shot areas on an actual wafer. Further, prior to exposure a correction map corresponding to specified shot data or similar is selected, and array coordinates for all shot areas are calculated through wafer replacement, search alignment, and EGA wafer alignment. Based on these array coordinates and the correction map, the wafer is moved and each of the shot areas is exposed. In this case also, this invention can be applied when modifying the projection magnification.

That is, when modifying the projection magnification for each shot area, image shifts similar to that described above occur.

Hence the main control device 23 modifies the magnification of the projection optical system PL through the image-forming characteristic correction device 51, based on the calculated amount of modification of the projection magnification, and also outputs to the stage control portion the image shift length S calculated using the above equation (1). By this means, the image shift length on the X direction is corrected through position adjustment of the wafer W (wafer stage 35). The Y-direction image shift length is corrected through scanning speed adjustment of the wafer W (wafer stage 35), similarly to the above case.

In this case also, when the above baseline value is used to position a shot area SA on the wafer W in the projection area 33, positioning may be performed using a driving amount obtained by adding the image shift length to the baseline value, or the baseline value corrected for the image shift length can be used to feed the wafer.

As explained above, in this embodiment, upon the occasion of corrections accompanying expansion/contraction of the reticle R and corrections accompanying EGA measurements, as well as corrections accompanying measurements of all shot areas, the projection magnification of the projection optical system PL is modified. Even when the center position of the projection area 33 is shifted, the position of the shot area SA on the wafer W is corrected according to the shift length. Consequently there is no longer a need to provide a separate optical element to address image shifts or to measure the baseline value upon each modification of the projection magnification, so that high-precision exposure processing can be performed without a reduction in throughput.

Further, in this embodiment, changes in image-forming characteristics arising from thermal deformation of the reticle R due to absorption of illumination light can be corrected with high precision, and declines in pattern transfer precision can be prevented.

In the above, preferred embodiments of the invention have been explained referring to the attached drawings; but of course the invention is not limited to these examples. In the above-described examples, the shapes, combinations and similar of the constituent members are examples, and various modifications can be made based on design requirements without deviating from the gist of the invention.

For example, in the above embodiments, examples were presented of application of this invention when performing corrections accompanying expansion/contraction of the reticle R, corrections accompanying EGA measurements, and corrections accompanying measurements of all shot areas; but the invention is not limited to these examples, and application to cases of modification of the projection magnification when performing reticle alignment is also possible.

Specifically, for example alignment marks drawn on the reticle R are irradiated with exposure light, and data of images of the alignment marks captured by a CCD (Charge Coupled Device) camera or similar is image-processed and mark positions measured, in a VRA (Visual Reticle Alignment) method; or, through aerial image measurements (AIS) by a device mounted on the measurement stage 36, the position, magnification and similar of the reticle R (pattern) can be measured, and this invention can be applied when modifying the projection magnification of the projection optical system PL based on the measured magnification, in a configuration in which the position of shot areas SA on the wafer W is corrected based on the calculated image shift length.

Modification of the projection magnification due to this reticle alignment, and correction of the exposure position accompanying modification of the magnification, are performed upon each measurement of the above-described baseline value, at the beginning of a lot of wafers for exposure processing, or in the middle of a lot as appropriate.

As the alignment sensor 43 in the above embodiments, in addition to a FIA (Field Image Alignment) type device in which light with a broad wavelength range emitted by a halogen lamp or other light source is used as illumination, performing image processing of data of images of alignment marks captured by a CCD camera or similar and measuring the mark positions, an LSA (Laser Step Alignment) type device, in which laser light irradiates alignment marks in dot rows on the wafer, and the light diffracted or scattered by the marks is used to detect mark positions, as well as an LIA (Laser Interferometric Alignment) type device, in which two coherent beams at an inclination to the pitch direction irradiate diffraction lattice-shape alignment marks on the wafer, the two diffracted beams resulting are caused to interfere, and the resulting phase is used to measure the alignment mark position, may be used.

Exposure apparatus applications are not limited to exposure apparatuses for semiconductor device manufacturing; for example, broad application is also possible to exposure apparatuses for liquid crystal device manufacturing, to expose rectangular glass plates to liquid crystal display element patterns, and to exposure apparatuses for manufacturing thin film magnetic heads, image capture devices (CCDs), micromachines, MEMS, DNA chips, reticles, and masks.

As the substrate, in addition to semiconductor wafers for use in semiconductor device manufacturing, glass substrates for display devices, ceramic wafers for thin film magnetic heads, and master masks (synthetic quartz, silicon wafers) for masks and reticles, as well as film members, and similar can be used. Moreover, substrates are not limited to round shapes, but may be rectangular or other shapes.

The light sources of exposure apparatuses to which this invention is applied are not limited to KrF excimer lasers (248 nm), ArF excimer lasers (193 nm), $F_2$ lasers (157 nm) or similar, and the g line (436 nm) and i line (365 nm) can be used. Further, the projection optical system is not limited to a reducing magnification, and an equal system or a magnification system may be used as well. Also, in the above embodiments, examples of catadioptric-type projection optical systems were described; but other systems may be used, and application is also possible to dioptric-type projection optical systems in which the optical axis (reticle center) of the projection optical system and the center of the projection area are set at different positions.

As the liquid used in liquid-immersion exposure, water (pure water) may be used; apart from water, for example perfluorinated polyether (PFPE) or fluorinated oil or another fluorinated liquid, or cedar oil or similar, may be used. Or, as the liquid, a liquid with higher refractive index for the exposure light than water may be used, such as for example a liquid with a refractive index of approximately 1.6 to 1.8. Further, the front optical element FL may be formed from a material with a higher refractive index (for example 1.6 or higher) than quartz or fluorite. Here, as a liquid LQ with refractive index higher than pure water (for example 1.5 or higher), for example isopropanol with a refractive index of approximately 1.50, glycerol (glycerin) with a refractive index of approximately 1.61, and other prescribed liquids having C—H bonds or O—H bonds, as well as hexane, heptane, decane, and other prescribed liquids (organic solvents), as well as decalin (decahydronaphthalene) with a refractive index of approximately 1.60, may be used. Further, as the liquid LQ two or more arbitrary liquids among these liquids may be mixed together and used, or one or more of these liquids may be added to (mixed with) pure water and used. Further, as the liquid LQ, pure water to which $H^+$, $Cs^+$, $K^+$, $Cl^-$, $SO_4^{2-}$, $PO_4^{2-}$, or other bases or acids are added (mixed) may be used, or pure water to which an Al oxide or other fine particles have been added (mixed) may be used. Also, as the liquid, it is preferable that a liquid be used which has a low optical absorption coefficient, a small temperature dependence, and which is stable with respect to photosensitive materials (or topcoat films, or anti-reflection films, or similar) applied to the surfaces of the projection optical system and/or substrate. As the liquid, a supercritical liquid can also be used. In addition, a topcoat film or similar can be provided on the substrate to protect photosensitive materials or substrates from the liquid. The front optical element may for example be formed from quartz (silica), or from fluorite, barium fluoride, strontium fluoride, lithium fluoride, sodium fluoride, or single-crystal materials of other fluoride compounds, or may be formed from materials with a refractive index higher than that of quartz or fluorite (for example 1.6 or higher). As materials with a refractive index of 1.6 or higher, for example, sapphire, germanium dioxide or similar disclosed in PCT International Publication No. WO 2005/059617, or potassium chloride (with a refractive index of approximately 1.75) disclosed in PCT International Publication No. WO 2005/059618, or similar can be used.

When using a liquid immersion method, as for example disclosed in PCT International Publication No. WO 2004/019128 (corresponding to U.S. Patent Application No. 2005/0248856), in addition to the optical path on the image-plane side of the front optical element, the optical path on the object-plane side of the front optical element may also be filled with a liquid. Further, a thin film having lyophilic properties and/or a dissolution-preventing function may be formed on a portion of (including at least the contact faces with the liquid) or the entirety of the front optical element. Quartz has high affinity to liquid and thus a dissolution preventive film is not necessary therefor. However, as for fluorite, it is preferable that at least a dissolution preventive film be formed thereon.

In each of the above embodiments, an interferometer system was used to measure position information for the mask stage and substrate stage; but other configurations are possible, and for example an encoder system may be used, in which a scale (diffraction grating) provided on the substrate stage surface is detected. In this case, it is preferable that a hybrid system be configured having both an interferometer system and an encoder system, and that the measurement results of the interferometer system be used to calibrate the measurement results of the encoder system. Further, stage position control may be performed with switching between the interferometer system and the encoder system, or with both used for position control.

In the above respective embodiments, a mask is used for forming a pattern. However, instead of this mask, an electronic mask (also called a variable form mask, an active mask or a pattern generator) for forming a variable pattern can be used. As an electronic mask, for example, a DMD (Deformable Micro-mirror Device or Digital Micro-mirror Device) as one type of non-radiative type image display element (also called a Spatial Light Modulator (SLM)) can be used. The DMD has a plurality of reflecting elements (fine mirrors) that are driven based on electronic data. The plurality of reflecting elements are arranged in a two-dimensional matrix shape on the surface of the DMD. They are driven for each of the elements to reflect and deflect the exposure light. The angle of the reflective surface of each reflective element is adjusted. DMD operation is controlled by a control device. The control device drives the DMD reflective elements based on electronic data (pattern information) according to the pattern to be formed on the substrate; the reflective elements form a shape from the exposure light emitted by the illumination system. By using a DMD, in contrast with cases in which a mask (reticle) on which a pattern is formed is used to perform exposure, there is no need to perform mask exchange tasks or mask positioning operations on the mask stage when the pattern is changed. In an exposure apparatus which uses electronic masks, a mask stage need not be provided, and it is sufficient to move the substrate in the X-axis and Y-axis directions using the substrate stage. An exposure apparatus using a DMD is for example disclosed in Japanese Unexamined Patent Application, Publication No. H08-313842, Japanese Unexamined Patent Application, Publication No. 2004-304135, and U.S. Pat. No. 6,778,257.

As far as is permitted, the disclosures in all of the Japanese Patent Publications and U.S. patents related to exposure apparatuses and the like cited in the above respective embodiments and modified examples, are incorporated herein by reference.

As described above, the exposure apparatus of the above embodiments is manufactured by assembling various subsystems including respective constituent elements, so that the prescribed mechanical precision, electrical precision and optical precision can be maintained. To ensure these respective precisions, performed before and after this assembly are adjustments for achieving optical precision with respect to the various optical systems, adjustments for achieving mechanical precision with respect to the various mechanical systems, and adjustments for achieving electrical precision with respect to the various electrical systems. The process of assembly of the exposure apparatus from these various subsystems includes mechanical connection, connection of wiring of electrical circuits, connection of pipes in pneumatic circuits, and similar between the various subsystems. Prior to the process of assembly of the exposure apparatus from these various subsystems, of course the processes of assembly of each of the individual subsystems are performed. When the process of assembly of the exposure apparatus from the various subsystems is completed, comprehensive adjustments are performed, and the various levels of precision of the exposure apparatus as a whole are secured. It is desirable that manufacture of the exposure apparatus be performed in a clean room in which temperature, cleanliness, and similar are controlled.

Figure 6:
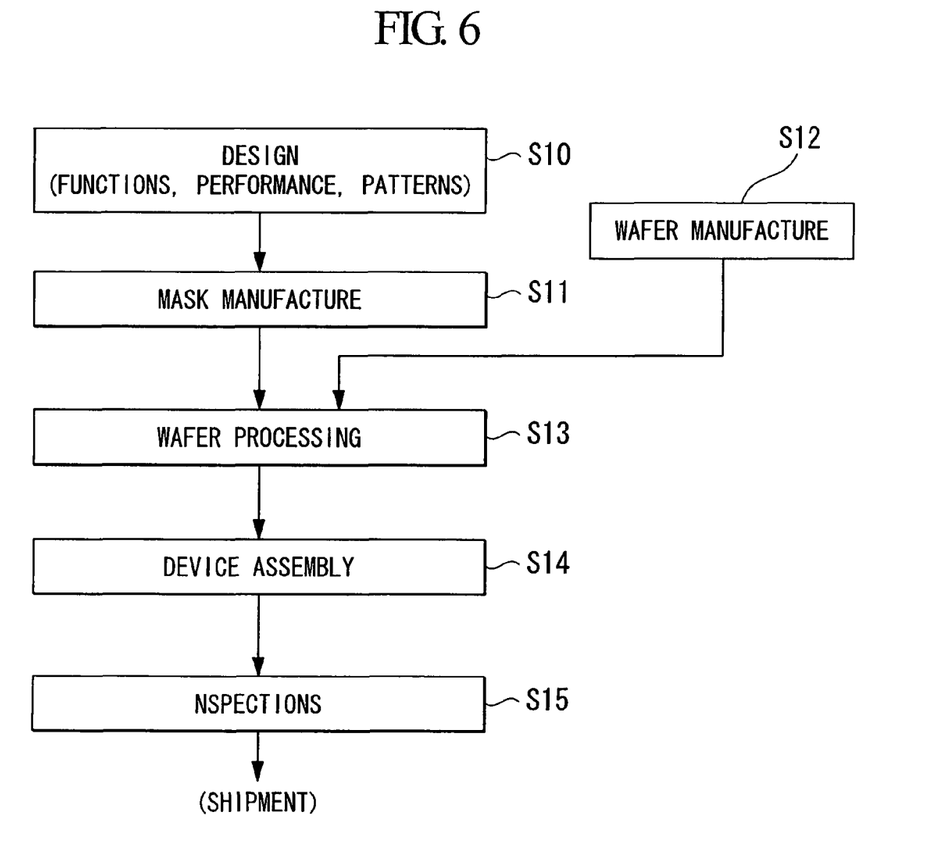
FIG. 6 is a flowchart showing an example of a microdevice manufacturing process.

Next, an embodiment of a method of manufacture of microdevices, using an exposure apparatus and exposure method of the above embodiments of the invention in the lithography process, is explained. FIG. 6 shows a flowchart of an example of the manufacture of microdevices (ICs, LSIs and other semiconductor chips, liquid crystal display panels, CCDs, thin film magnetic heads, micromachines, or similar).

First, in step S10 (design step), the function and performance design of the microdevice (for example, circuit design of a semiconductor device and similar) is performed, and patterns are designed to realize these functions. Next, in step S11 (mask manufacture step), a mask (reticle) on which the designed circuit pattern is formed is manufactured. In step S12 (wafer manufacturing step), silicon or another material is used to manufacture a wafer.

Next, in step S13 (wafer processing step), the mask and wafer prepared in steps S10 through S12 are used to form actual circuits or similar on the wafer using lithography technology and similar, as described below. Then, in step S14 (device assembly step), the wafer processed in step S13 is used to perform device assembly. This step S114 may include, as necessary, a dicing process, bonding process, and packaging (chip sealing) process, and similar. Finally, in step S15 (inspection step), the microdevices manufactured in step S14 are subjected to operation confirmation tests, durability tests, and other inspections. Having passed through these processes, the microdevices are completed, and are shipped.

Figure 7:
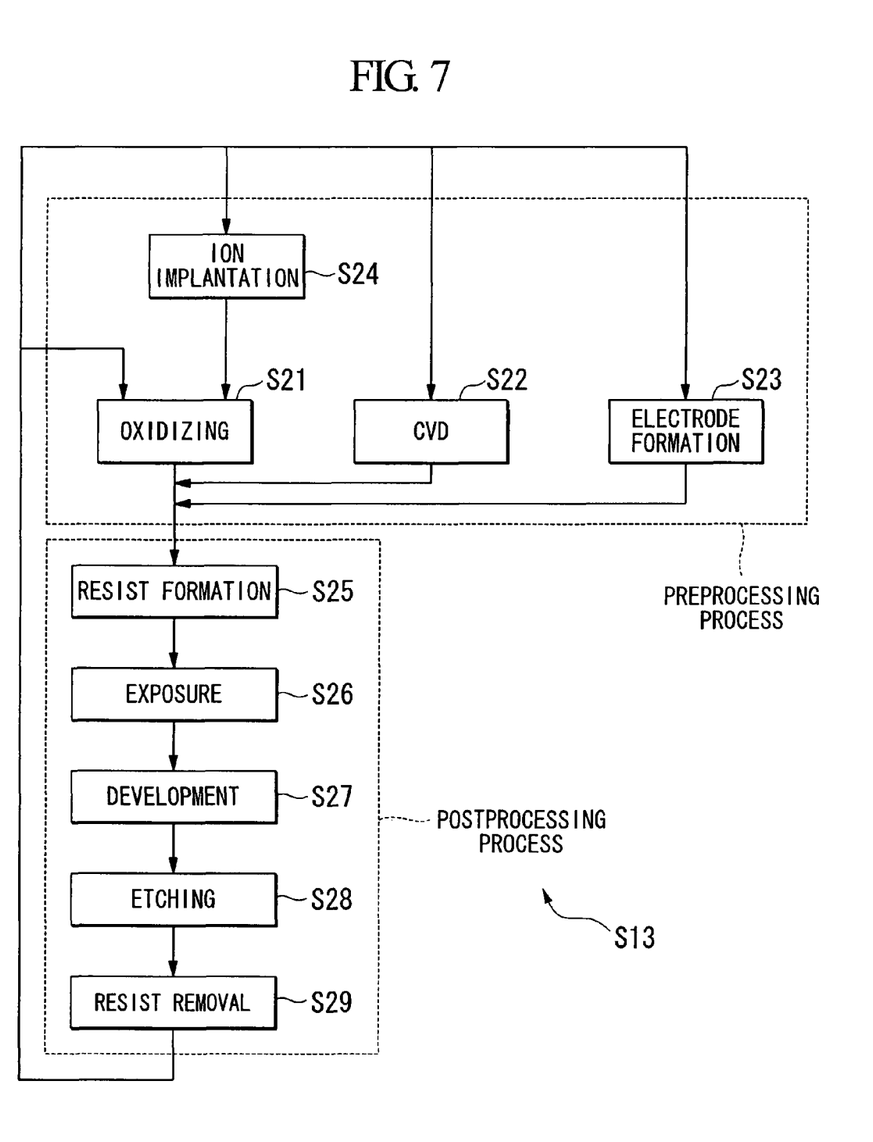
FIG. 7 shows an example of the detailed process of step S13 in FIG. 6.

FIG. 7 shows an example of the detailed process of step S13, for a case of semiconductor device manufacturing.

In step S21 (oxidizing step), the wafer surface is oxidized. In step S22 (CVD step), an insulating film is formed on the wafer surface. In step S23 (electrode formation step), electrodes are formed by vapor deposition on the wafer. In step S24 (ion implantation step), ions are implanted into the wafer. The above steps S21 to S24 constitute the preprocessing process of each stage of wafer processing, which is selected and executed as necessary according to the processing required in each stage.

In each stage of the wafer process, when the above-described preprocessing process ends, a postprocessing process is executed as follows. In the postprocessing process, first in step S25 (resist formation step) a photosensitive material is applied to the wafer. Then, in step S26 (exposure step), the lithography system (exposure apparatus) and exposure method described above are used to transfer the circuit pattern of the mask onto the wafer. Next, in step S27 (development step), the exposed wafer is developed, and in step S28 (etching step), exposed members of portions other than portions on which resist remains are removed by etching. Then, in step S29 (resist removal step), resist which is no longer needed after the end of etching is removed. By repeating these pre-processing and postprocessing processes and, superposed circuit patterns are formed on the wafer.

In addition to semiconductor elements and other microdevices, this invention can also be applied to exposure apparatuses which transfer circuit patterns from a mother reticle to a glass substrate, silicon wafer or similar to manufacture a reticle for use in exposure apparatuses, EUV exposure apparatuses, X-ray exposure apparatuses, electron beam exposure apparatuses, and similar. Here, in exposure apparatuses using DUV (deep ultraviolet) and VUV (vacuum ultraviolet) light and similar, transmissive reticles are generally used; as the reticle substrate, quartz glass, quartz glass doped with fluorine, fluorite, magnesium fluoride, a quartz crystal, or similar is used. In proximity-type X-ray exposure apparatuses and electron beam exposure apparatuses and similar, transmissive-type masks (stencil masks, membrane masks) are used; as the mast substrate, silicon wafers or similar are employed. Such exposure apparatuses are disclosed in PCT International Publication Nos. WO 99/34255, WO 99/50712, WO 99/66370, Japanese Unexamined Patent Application, Publication Nos. Hi 1-194479, 2000-12453, and 2000-29202.

By means of this invention, even when there is a shift in the center position of the projection area accompanying modification of the projection magnification, installation of an image shift optical element and/or repeated baseline value measurements upon each modification of the projection magnification are avoided, and high-precision exposure processing is possible.

What is claimed is:

1. An exposure apparatus comprising:
a projection optical system that exposes a predetermined exposure area on a substrate with a pattern of a mask at a predetermined projection magnification, a center of an optical axis of the projection optical system being set at a different position from a center of a projection area onto which the pattern is projected;
a control device that adjusts a relative position relationship between the mask and the substrate and that controls simultaneously scanning movement of the mask and the substrate in a prescribed direction;
a magnification modification device that modifies the projection magnification of the projection optical system;
a calculation device that calculates a first shift length of the center of the projection area in a direction intersecting with the prescribed direction, associated with modification of the projection magnification, and calculates a second shift length of the center of the projection area in the prescribed direction, associated with the modification of the projection magnification; and
a correction device connected to the control device and that, based on the first shift length, corrects a relative position between the mask and the substrate in the direction intersecting with the prescribed direction and, based on the second shift length, corrects a scanning condition in the prescribed direction for the mask and the substrate,
wherein the scanning condition comprises a velocity ratio between the mask and the substrate, or a synchronous velocity of motion of the mask and the substrate.

2. The exposure apparatus according to claim 1, further comprising a substrate measurement device that measures a substrate mark formed on the substrate, and wherein the calculation device calculates the first and second shift lengths based on modification information of the projection magnification obtained from a measurement result of the substrate measurement device.

3. The exposure apparatus according to claim 1, further comprising a mask measurement device that measures a mask mark formed on the mask, and wherein the calculation device calculates the first and second shift lengths based on modification information of the projection magnification obtained from a measurement result of the mask measurement device.

4. The exposure apparatus according to claim 1, further comprising an expansion measurement device that measures information relating to expansion and contraction of the mask, and wherein the calculation device calculates the first and second shift lengths based on modification information of the projection magnification obtained from a measurement result of the expansion measurement device.

5. The exposure apparatus according to claim 2, wherein the correction device corrects the relative position and the scanning condition based on position information of the exposure area obtained from the measurement result of the substrate measurement device and the first and second shift lengths.

6. The exposure apparatus according to claim 3, wherein the correction device corrects the relative position and the scanning condition based on position information of the mask obtained from the measurement result of the mask measurement device and the first and second shift lengths.

7. The exposure apparatus according to claim 1, wherein the scanning condition comprises the velocity ratio.

8. The exposure apparatus according to claim 1, wherein the projection area onto which the pattern is projected has a slit shape.

9. The exposure apparatus according to claim 8, wherein the projection optical system is a catadioptric system.

10. The exposure apparatus according to claim 1, wherein the scanning condition comprises the synchronous velocity of motion of the mask and the substrate.

11. An exposure method comprising:
setting an optical center of a projection optical system which projects a pattern of a mask onto a prescribed exposure area on a substrate with a prescribed projection magnification and a center of the projection area onto which the pattern is projected, to differing positions, for exposure;
performing simultaneously scanning movement of the mask and the substrate in a prescribed direction;
modifying the projection magnification of the projection optical system;
calculating a first shift length of the center of the projection area in a direction intersecting with the prescribed direction, associated with modification of the projection magnification, and calculating a second shift length of the center of the projection area in the prescribed direction, associated with the modification of the projection magnification; and
based on the first shift length, correcting a relative position between the mask and the substrate in the direction intersecting with the prescribed direction and, based on the second shift length, correcting a scanning condition in the prescribed direction for the mask and the substrate,
wherein the scanning condition comprises a velocity ratio between the mask and the substrate, or a synchronous velocity of motion of the mask and the substrate.

12. A device manufacturing method, comprising a lithography process, wherein the lithography process employs the exposure method according to claim 11.

13. The exposure method according to claim 11, further comprising:
measuring a substrate mark formed on the substrate,
wherein the first and second shift lengths are calculated based on modification information of the projection magnification obtained from a measurement result of the substrate mark.

14. The exposure method according to claim 11, further comprising:
measuring a mask mark formed on the mask,
wherein the first and second shift lengths are calculated based on modification information of the projection magnification obtained from a measurement result of the mask mark.

15. The exposure method according to claim 11, further comprising:
measuring information relating to expansion and contraction of the mask,
wherein the first and second shift lengths are calculated based on modification information of the projection magnification obtained from a measurement result of the expansion and contraction.

* * * * *